(12) United States Patent
Lee et al.

(10) Patent No.: US 9,343,235 B2
(45) Date of Patent: May 17, 2016

(54) MULTILAYER CERAMIC CAPACITOR AND ASSEMBLY BOARD HAVING THE SAME

(71) Applicant: SAMSUNG ELECTRO-MECHANICS CO., LTD., Suwon-Si, Gyeonggi-Do (KR)

(72) Inventors: Jong Ho Lee, Suwon-Si (KR); Doo Young Kim, Suwon-Si (KR); Chang Hoon Kim, Suwon-Si (KR); Myung Jun Park, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 133 days.

(21) Appl. No.: 14/444,587

(22) Filed: Jul. 28, 2014

(65) Prior Publication Data

US 2015/0287533 A1    Oct. 8, 2015

(30) Foreign Application Priority Data

Apr. 3, 2014    (KR) ......................... 10-2014-0039816

(51) Int. Cl.
| | |
|---|---|
| *H01G 4/12* | (2006.01) |
| *H01G 4/20* | (2006.01) |
| *H01G 4/30* | (2006.01) |
| *H01G 2/06* | (2006.01) |
| *H01G 4/248* | (2006.01) |
| *H01G 4/236* | (2006.01) |
| *H05K 3/34* | (2006.01) |

(52) U.S. Cl.
CPC ................. *H01G 4/30* (2013.01); *H01G 2/065* (2013.01); *H01G 4/12* (2013.01); *H01G 4/236* (2013.01); *H01G 4/248* (2013.01); *H05K 3/3442* (2013.01); *H05K 2201/10015* (2013.01); *H05K 2201/10636* (2013.01)

(58) Field of Classification Search
CPC ..... H01G 4/12; H01G 4/1209; H01G 4/1218; H01G 4/1227; H01G 4/1236; H01G 4/1245; H01G 4/4254; H01G 4/1263; H01G 4/1272; H01G 4/1281; H01G 4/129; H01G 4/236
See application file for complete search history.

(56) References Cited

FOREIGN PATENT DOCUMENTS

| | | |
|---|---|---|
| JP | 5-74644 A | 3/1993 |
| JP | 7-57935 A | 3/1995 |
| KR | 10-0586962 A | 6/2006 |

*Primary Examiner* — Jeremy C Norris
(74) *Attorney, Agent, or Firm* — McDermott Will & Emery LLP (57) ABSTRACT

A multilayer ceramic capacitor may include: a ceramic body having upper and lower surfaces opposing each other in a thickness direction thereof and first and second end surfaces opposing each other in a length direction thereof, a thickness of the ceramic body being greater than a width thereof; a first external electrode disposed on the first end surface to allow a predetermined region of the first end surface adjacent to the upper surface to be exposed; a second external electrode disposed on the second end surface to allow a predetermined region of the second end surface adjacent to the upper surface to be exposed; and first and second internal electrodes disposed within the ceramic body, stacked in a width direction of the ceramic body, and connected to the first and second external electrodes, respectively.

18 Claims, 5 Drawing Sheets

MULTILAYER CERAMIC CAPACITOR AND ASSEMBLY BOARD HAVING THE SAME

CROSS-REFERENCE TO RELATED APPLICATION

This application claims the benefit of Korean Patent Application No. 10-2014-0039816 filed on Apr. 3, 2014, with the Korean Intellectual Property Office, the disclosure of which is incorporated herein by reference.

BACKGROUND

The present disclosure relates to a multilayer ceramic capacitor and a board having the same.

A multilayer ceramic capacitor includes a plurality of stacked dielectric layers, internal electrodes disposed to face each other with respective dielectric layers interposed therebetween, and external electrodes electrically connected to the internal electrodes.

A multilayer ceramic capacitor may be mounted on a circuit board for use in a product. In addition, at the time of mounting the multilayer ceramic capacitor on the circuit board, a mounting pad on the circuit board and an external electrode may be electrically connected to each other through solder, and the mounting pad may be connected to an external circuit through a wiring pattern on the circuit board or a conductive via.

SUMMARY

An embodiment of the present disclosure may provide a multilayer ceramic capacitor and a board having the same.

According to an exemplary embodiment of the present disclosure, a multilayer ceramic capacitor may include: a ceramic body having a thickness greater than a width; internal electrodes disposed within the ceramic body; and external electrodes disposed on external surfaces of the ceramic body.

The external electrodes may be disposed on end surfaces of the ceramic body, respectively, to allow predetermined regions of the end surfaces of the ceramic body adjacent to an upper surface of the ceramic body to be exposed, thereby improving mounting stability of the multilayer ceramic capacitor.

The internal electrodes may be disposed within the ceramic body to be perpendicular to a board at the time of mounting the multilayer ceramic capacitor on the board, and the center of gravity of the multilayer ceramic capacitor may be positioned below the center of gravity of the ceramic body.

According to an exemplary embodiment of the present disclosure, An assembly board having a multilayer ceramic capacitor may include: a printed circuit board having first and second electrode pads disposed thereon; and the multilayer ceramic capacitor disposed on the printed circuit board, wherein the multilayer ceramic capacitor includes a ceramic body having a thickness larger than a width, first and second external electrodes disposed on end surfaces of the ceramic body, respectively, to allow predetermined regions of the end surfaces of the ceramic body adjacent to an upper surface of the ceramic body to be exposed, and internal electrodes disposed within the ceramic body and connected to the external electrodes, respectively.

The multilayer ceramic capacitor may be mounted on the printed circuit board such that the lower surface of the ceramic body is adjacent to and faces the printed circuit board.

Another embodiment of the present disclosure relates to a multilayer ceramic capacitor comprising a ceramic body having upper and lower surfaces opposing each other in a thickness direction thereof and first and second end surfaces opposing each other in a length direction thereof. The multilayer ceramic capacitor further comprises a first group of internal electrodes disposed within the ceramic body and surrounded by a dielectric layer such that a portion of each of the first group of internal electrodes is exposed to the first end surface, and a second group of internal electrodes disposed within the ceramic body and surrounded by the dielectric layer such that a portion of each of the second group of internal electrodes is exposed to the second end surface.

A first external electrode is disposed on the first end surface to cover the entirety of the exposed portion of the first group of internal electrodes, and a second external electrode is disposed on the second end surface to cover the entirety of the exposed portion of the first group of internal electrodes.

The first group of internal electrodes and the second group of internal electrodes are alternately stacked in a width direction of the ceramic body, and connected to the first and second external electrode respectively.

The exposed portions of the first and second groups of internal electrodes are disposed below the center of first and second end surfaces. The first and second external electrodes cover the lower surface of the ceramic body.

Each of the first group of internal electrodes includes a first main electrode part and a first lead part connected to the first main electrode part and protruding to the first end surface, and each of the second group of internal electrodes includes a second main electrode part and a second lead part connected to the second main electrode part and protruding to the second end surface. Each of the first and second lead parts has a width narrower than that of each of the first and second main electrode parts.

A distance of the exposed portion of the first group of internal electrodes and a distance of the exposed portion of the second group of internal electrodes are equal to or less than $2/5$ of the thickness of the ceramic body. A height of each of the first and second external electrodes disposed on the first and second end surfaces is equal to or less than $1/2$ of the thickness of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Multilayer Ceramic Capacitor (100)

Figure 1:
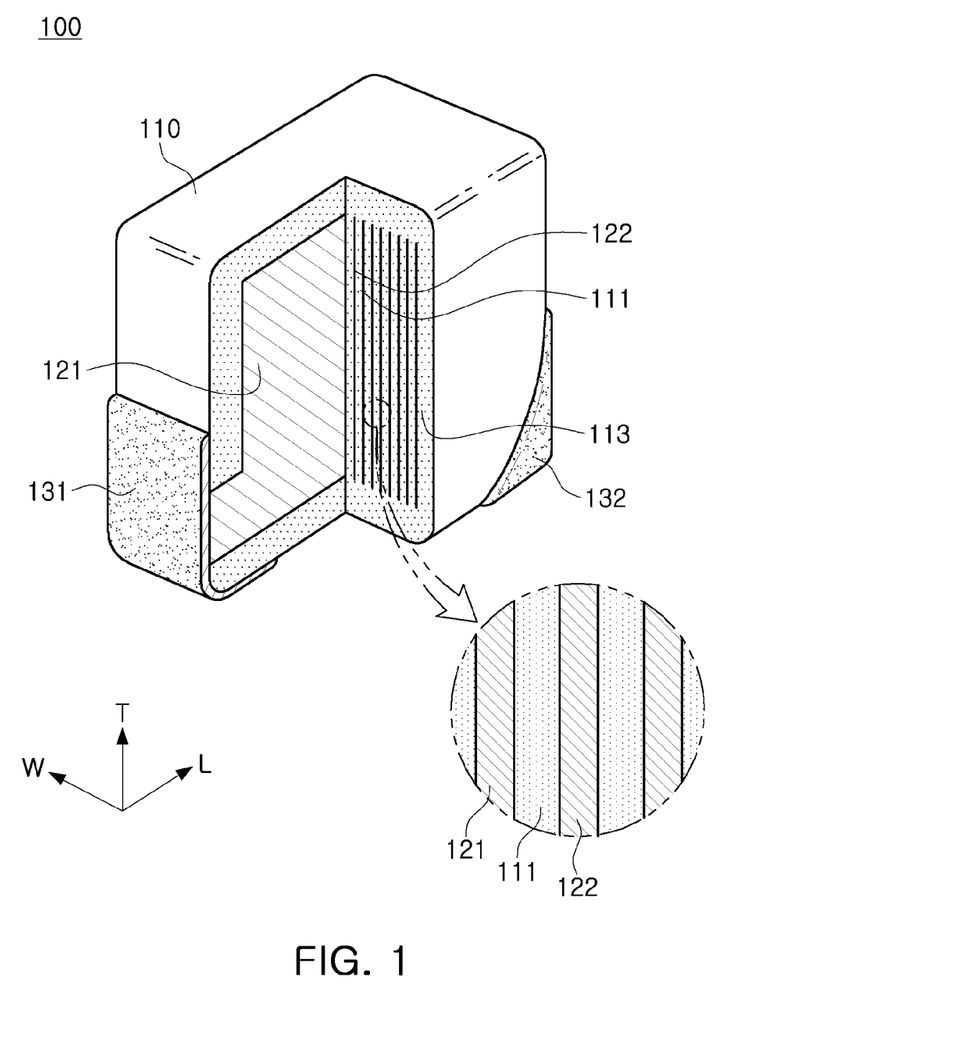
FIG. 1 is a partially cut-away perspective view schematically illustrating a multilayer ceramic capacitor according to an exemplary embodiment of the present disclosure.

FIG. 1 is a partially cut-away perspective view schematically illustrating a multilayer ceramic capacitor according to an exemplary embodiment of the present disclosure.

Referring to FIG. 1, a multilayer ceramic capacitor 100 according to an exemplary embodiment of the present disclosure may include a ceramic body 110 and external electrodes 131 and 132.

As shown in FIG. 1, the external electrodes 131 and 132 may be disposed on external surfaces of the ceramic body 110, while partially facing one surface of the ceramic body 110 in a thickness direction thereof on end surfaces of the ceramic body 110.

For example, the external electrodes 131 and 132 are not disposed in predetermined regions of the ceramic body 110 adjacent to an upper surface of the ceramic body, but may be disposed in predetermined regions of the ceramic body 110 adjacent to a lower surface of the ceramic body.

In a case in which the external electrodes 131 and 132 partially face one surface of the ceramic body 110 in the thickness direction thereof on the end surfaces of the ceramic body 110 as described above, a phenomenon in which a chip topples over at the time of mounting the multilayer ceramic capacitor on a board is decreased, whereby mounting stability may be secured.

Hereinafter, the multilayer ceramic capacitor 100 according to an exemplary embodiment of the present disclosure will be described in detail.

Figure 2:
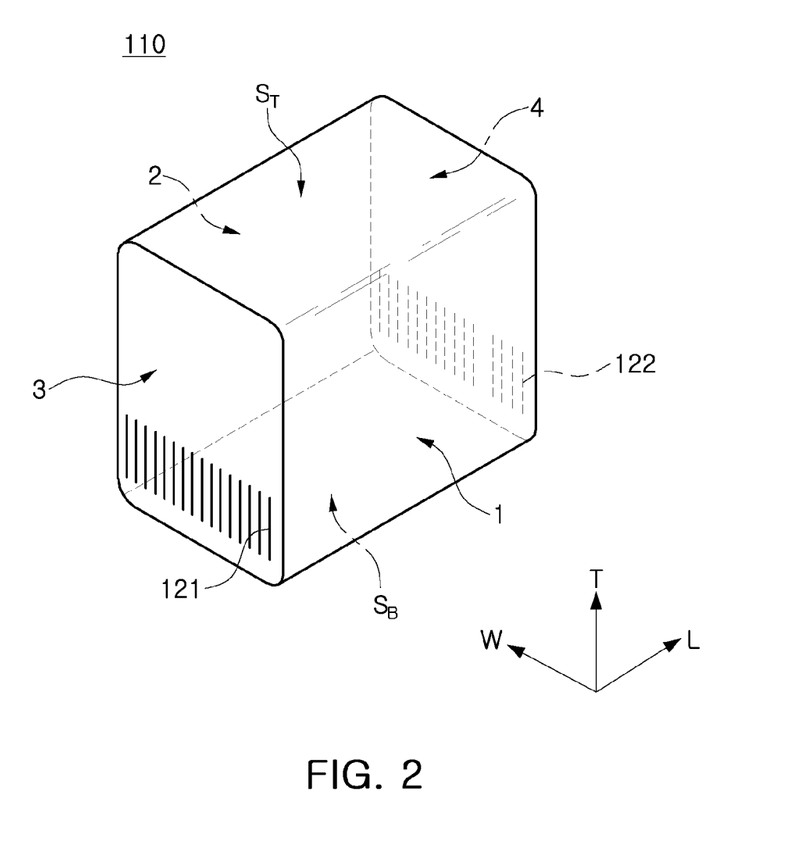
FIG. 2 is a perspective view schematically illustrating a ceramic body of the multilayer ceramic capacitor according to an exemplary embodiment of the present disclosure.
Figure 3:
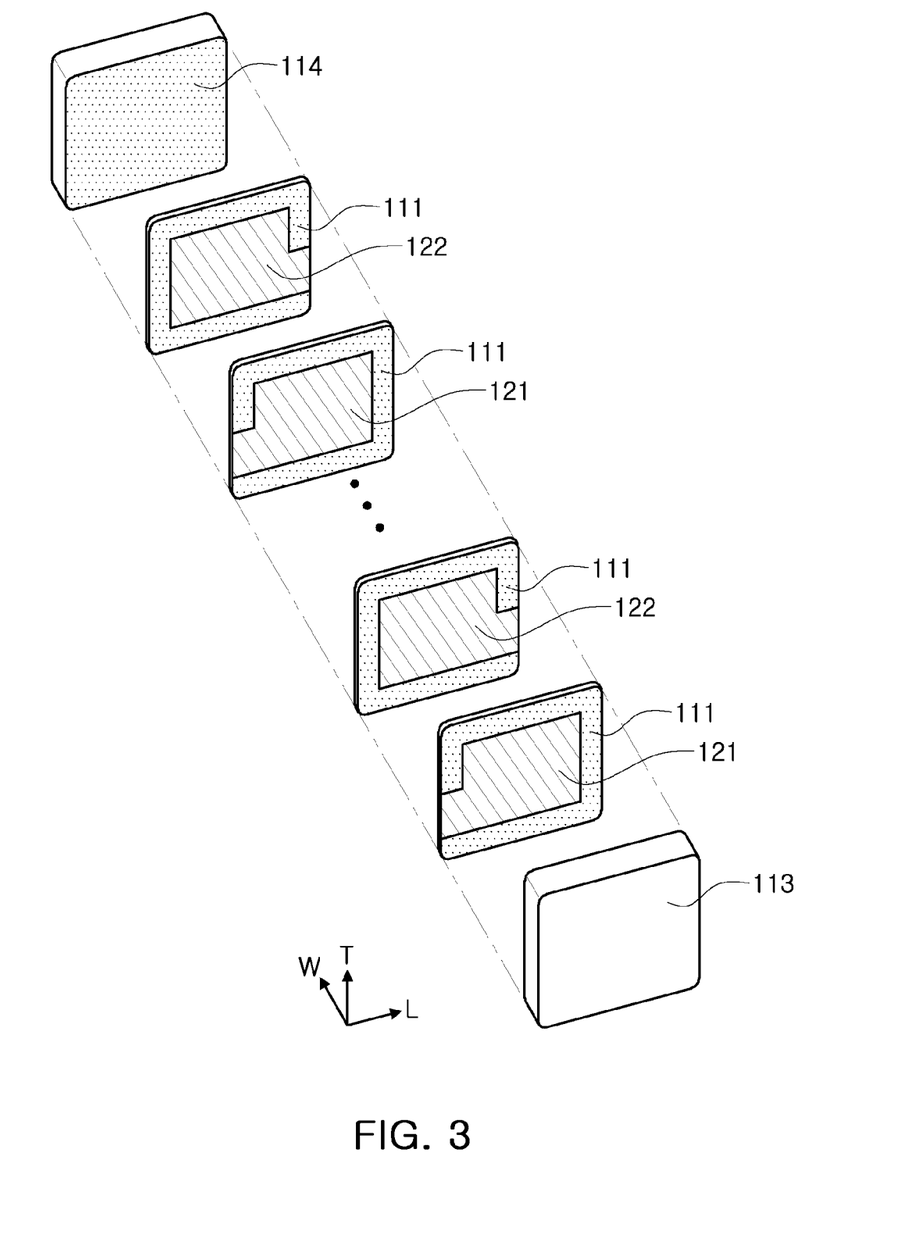
FIG. 3 is an exploded perspective view of the ceramic body of the multilayer ceramic capacitor according to an exemplary embodiment of the present disclosure.

FIG. 2 is a perspective view schematically illustrating the ceramic body 110 of the multilayer ceramic capacitor 100 according to an exemplary embodiment of the present disclosure, and FIG. 3 is an exploded perspective view of the ceramic body 110 of the multilayer ceramic capacitor 100 according to an exemplary embodiment of the present disclosure.

Referring to FIGS. 2 and 3, the ceramic body 110 may include a plurality of dielectric layers 111 and may have upper and lower surfaces $S_T$ and $S_B$ opposing each other in the thickness direction thereof, first and second side surfaces 1 and 2 opposing each other in a width direction thereof, and first and second end surfaces 3 and 4 opposing each other in a length direction thereof. A shape of the ceramic body 110 is not particularly limited. As shown in FIGS. 2 and 3, the ceramic body 110 does not have a hexahedral shape having completely straight lines, but may have an approximately hexahedral shape.

The ceramic body 110 may be formed by stacking the plurality of dielectric layers 111. As shown in FIGS. 2 and 3, the ceramic body may include internal electrodes 121 and 122 formed on the dielectric layers 111 and may be formed by stacking the plurality of dielectric layers on which the internal electrodes are formed. The internal electrodes may include first and second internal electrodes 121 and 122, and the first and second internal electrodes 121 and 122 may be alternately disposed on the dielectric layers, each of the dielectric layers 111 being interposed between the first and second internal electrodes 121 and 122, and may be stacked in the width (W) direction of the ceramic body.

The first and second internal electrodes 121 and 122 may be alternately exposed through the first and second end surfaces 3 and 4 of the ceramic body, respectively.

In addition, the ceramic body 110 may include cover layers 113 and 114 disposed outside of the outermost internal electrodes, respectively, in order to protect the internal electrodes from external impacts.

According to an exemplary embodiment of the present disclosure, a W-direction indicated in FIGS. 1 and 2, the width direction of the ceramic body 110, refers to a direction in which the internal electrodes 121 and 122 and the dielectric layers 111 are stacked, an L-direction refers to the length direction of the ceramic body 110, and a T-direction refers to the thickness direction of the ceramic body 110.

Here, the 'width direction' is used to have the same concept as a direction in which the dielectric layers are stacked, that is, a 'stacking direction'.

In addition, the multilayer ceramic capacitor 100 according to an exemplary embodiment of the present disclosure may be disposed on a board such that the thickness (T) direction of the ceramic body 110 is perpendicular to the board when the multilayer ceramic capacitor is mounted on the board.

The multilayer ceramic capacitor according to an exemplary embodiment of the present disclosure may have a form in which a thickness of the ceramic body 110 is not substantially the same as a width of the ceramic body 110, but is greater than the width of the ceramic body, in order to implement a high degree of capacitance.

The multilayer ceramic capacitor 100 according to an exemplary embodiment of the present disclosure may secure a sufficient amount of a mounting space when being mounted on a board and implement a degree of high capacitance due to an increase in the thickness of the ceramic body 110. The internal electrodes 121 and 122 are stacked in the width direction of the ceramic body 110 and the thickness of the ceramic body 110 is increased, such that an area in which the internal electrodes are overlapped with each other may be increased. Therefore, even in a case an area occupied by the multilayer ceramic capacitor at the time of mounting the multilayer ceramic capacitor on a board is same, a further increased capacitance may be secured.

In a case in which the thickness of the ceramic body 110 is greater than the width of the ceramic body 110 as in an exemplary embodiment of the present disclosure, a high degree of capacitance may be secured. However, in this case, due to a rise in the center of gravity of the multilayer ceramic capacitor, a chip may be inclined in a taping pocket in a pick-up process at the time of mounting the multilayer ceramic capacitor, such that a defect in which the chip is not picked up may occur or the frequency of a phenomenon in which the chip topples over in a mounting process may be increased.

However, according to an exemplary embodiment of the present disclosure, in a case in which the external electrodes 131 and 132 are partially disposed toward one surface of the ceramic body 110 in the thickness direction thereof on the end surfaces of the ceramic body 110, the above-mentioned defects may be solved.

The ceramic body 110 may be formed by stacking and sintering the plurality of dielectric layers 111 and the internal electrodes 121 and 122, and a shape and dimensions of the ceramic body 110 and the number of stacked dielectric layers 111 are not limited to those shown in the exemplary embodiment.

According to an exemplary embodiment of the present disclosure, an average thickness of the dielectric layers 111 may be arbitrarily changed in accordance with a capacitance design of the multilayer ceramic capacitor.

In addition, the dielectric layers 111 may contain a ceramic powder having a high dielectric constant, for example, a barium titanate ($BaTiO_3$) based powder or a strontium titanate ($SrTiO_3$) based powder. However, the present disclosure is not limited thereto.

The cover layers 113 and 114 may be formed of the same material as that of the dielectric layers 111 and have the same configuration as that of the dielectric layers 111 except that they do not include the internal electrodes therein. The cover layers may be formed by stacking a single dielectric layer or two or more dielectric layers on side surfaces of an active layer in the width direction, respectively, the active layer having the internal electrodes alternately stacked therein, and may prevent damage to the first and second internal electrodes 121 and 122 due to physical or chemical stress.

For example, the cover layers may be formed by stacking ten or more dielectric layers on which the internal electrodes are not formed.

A material for forming the first and second internal electrodes 121 and 122 is not particularly limited, but may be a conductive paste formed of at least one selected from a group consisting of, for example, a noble metal material such as palladium (Pd), a palladium-silver (Pd—Ag) alloy, and the like, nickel (Ni), and copper (Cu).

Meanwhile, the first and second internal electrodes 121 and 122, a pair of electrodes having different polarities, may be formed by printing a conductive paste including a conductive metal on the respective dielectric layers 111 at a predetermined thickness.

An average thickness of the first and second internal electrodes 121 and 122 after being sintered is not particularly limited as long as a capacitance may be generated. For example, the average thickness of the first and second internal electrodes may be 1.5 µm or less.

According to an exemplary embodiment of the present disclosure, the first and second internal electrodes 121 and 122 may be disposed to be perpendicular to the upper surface $S_T$ or the lower surface $S_B$ of the ceramic body. For example, the first and second internal electrodes 121 and 122 may be disposed to be perpendicular to the lower surface (mounting surface) of the ceramic body, a surface facing a board at the time of mounting the multilayer ceramic capacitor on the board.

In the present disclosure, the first and second polarities may be different polarities.

Figure 4:
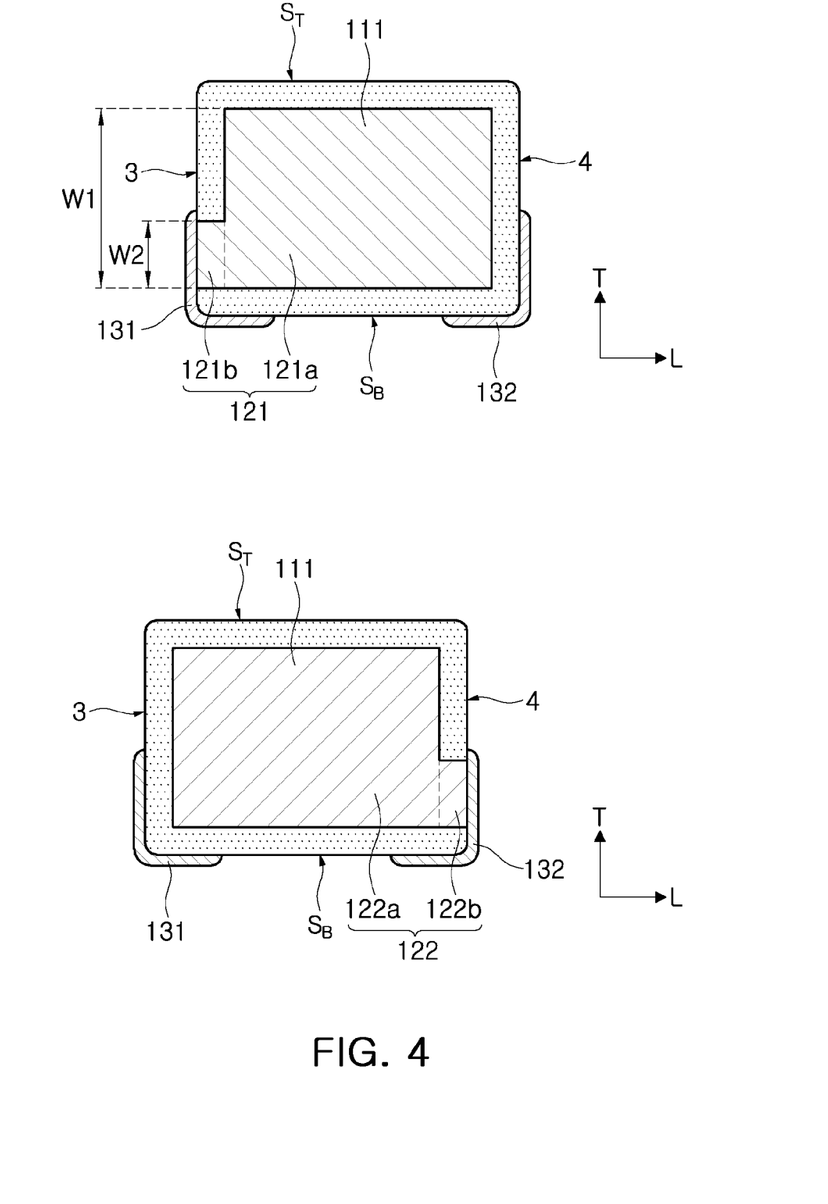
FIG. 4 is cross-sectional views of the multilayer ceramic capacitor according to an exemplary embodiment of the present disclosure taken in a length-thickness direction thereof.

FIG. 4, cross-sectional views of the multilayer ceramic capacitor 100 according to an exemplary embodiment of the present disclosure taken in a length-thickness direction thereof, illustrate a single dielectric layer 111, the first and second internal electrodes 121 and 122 disposed on the dielectric layer 111, and the first and second external electrodes 131 and 132.

Referring to FIG. 4, the first internal electrode 121 may include a first main electrode part 121a mainly contributing to formation of capacitance, and a first lead part 121b extending from the first main electrode part and protruding to the external surface of the ceramic body, and the second internal electrode 122 may include a second main electrode part 122a mainly contributing to formation of capacitance and a second lead part 122b extending from the second main electrode part and protruding to the external surface of the ceramic body.

The first lead part 121b may be electrically connected to the first external electrode 131, and the second lead part 122b may be electrically connected to the second external electrode 132.

The first lead part 121b may be exposed to the first end surface 3 of the ceramic body, and the second lead part 122b may be exposed to the second end surface 4 of the ceramic body.

As shown in FIG. 4, when a width of each of the first and second main electrode parts 121a and 122a is defined as W1 and a width of each of the first and second lead parts 121b and 122b is defined as W2, the first and second internal electrodes 121 and 122 may be formed such that W2<W1 is satisfied. That is, the widths of the first and second main electrode parts 121a, 122a may be greater than those of the first and second lead parts 121b, 122b. Even in a case in which the widths of the first and second lead parts 121b, 122b are small as described above, the widths of the first and second main electrode parts 121a, 122a are formed to be greater than those of the first and second lead parts 121b, 122b, whereby a sufficient capacitance may be secured.

According to an exemplary embodiment of the present disclosure, as shown in FIG. 4, one end portion of each of the first and second main electrode parts 121a and 122a and one end portion of each of the first and second lead parts 121b and 122b may be formed along the same line. For example, lower end portions of the first main electrode part 121a and the first lead part 122a may be formed along the same line, and lower end portions of the second main electrode part 122a and the second lead part 122b may be formed along the same line. In a case in which each of the first and second lead parts 121b, 122b is formed to have a width narrower than that of each of the first and second main electrode parts 121a, 122a and the lower end portion of each of the first and second lead parts 121b, 122b and the lower end portion of each of the first and second main electrode parts 121a, 122a are formed along the same line, as described above, the center of gravity of the ceramic body may moved downwardly in the thickness direction of the ceramic body by the first and second lead parts 121b, 122b disposed at a relatively lower portion in the ceramic body. Therefore, the multilayer ceramic capacitor may be more stably mounted on a board.

A distance of a portion of the first lead part 121b exposed to the first end surface 3 and a distance of a portion of the second lead part 122b exposed to the second end surface 4 may be equal to or less than ⅔ of the thickness of the ceramic body in order to efficiently move the center of gravity of the ceramic body downwardly in the thickness direction of the ceramic body, but is not limited thereto. Since the center of gravity of the ceramic body moves downwardly and then rises in a case in which the distances of the portions of the first and second lead parts exposed to the first and second end surfaces, respectively, exceed ⅔ of the thickness of the ceramic body, the distances of the portions of the first and second lead parts 121b, 122b exposed to the first and second end surfaces 3, 4, respectively, may be equal to or less than ⅔ of the thickness of the ceramic body, but the present disclosure is not necessarily limited thereto.

Particularly, according to an exemplary embodiment of the present disclosure, the first and second internal electrodes 121 and 122 are stacked in the width direction of the ceramic body 110. Thus, even in a case in which the external electrodes 131 and 132 partially face one surface of the ceramic body in the thickness direction on the end surfaces of the ceramic body, the number of stacked internal electrodes 121 and 122 may not be affected thereby.

In a case in which the first and second internal electrodes are stacked in the thickness direction of the ceramic body unlike an exemplary embodiment of the present disclosure, and the external electrodes partially face one surface of the ceramic body in the thickness direction, the first and second internal electrodes need to be formed in the ceramic body within a thickness range of the external electrodes, in order to be electrically connected to the external electrodes. However, in a case in which the internal electrodes 121 and 122 are stacked in the width direction of the ceramic body as in an exemplary embodiment of the present disclosure, electrical connections between the internal electrodes 121 and 122 and the external electrodes 131 and 132 may be secured by determining the widths and positions of the lead parts 121b and 122b of the internal electrodes. Therefore, even in a case in which the external electrodes 131 and 132 partially face one surface of the ceramic body 110 in the thickness direction on the first and second end surfaces 3 and 4, the number of stacked internal electrodes 121 and 122 may not be affected thereby.

Therefore, according to an exemplary embodiment of the present disclosure, a multilayer ceramic capacitor capable of securing mounting stability and implementing a high capacitance may be provided.

According to an exemplary embodiment of the present disclosure, the external electrodes 131 and 132 maybe disposed in predetermined regions of the first and second end surfaces 3 and 4 of the ceramic body adjacent to the lower surface $S_B$ of the ceramic body in order to allow predetermined regions of the first and second end surfaces 3 and 4 of the ceramic body adjacent to the upper surface $S_T$ of the ceramic body to be exposed.

According to an exemplary embodiment of the present disclosure, the external electrodes 131 and 132 maybe disposed on the first and second end surfaces 3 and 4 of the ceramic body 110, respectively, and may partially face one surface of the ceramic body 110 in the thickness direction thereof.

Particularly, the first and second external electrodes 131 and 132 may partially face the first and second end surfaces 3 and 4 downwardly in the thickness direction of the ceramic body 110 so as to be adjacent to the lower surface of the ceramic body forming the mounting surface.

For example, the first and second external electrodes 131 and 132 may be formed on the first and second end surfaces 3 and 4 in such a manner that they may be extended from corners at which the lower surface $S_B$ of the ceramic body meets the first and second end surfaces 3 and 4 of the ceramic body to predetermined heights of the first and second end surfaces, respectively. In addition, the first and second external electrodes 131 and 132 are not formed from corners at which the upper surface $S_T$ of the ceramic body meets the first and second end surfaces 3 and 4 of the ceramic body to predetermined regions of the first and second end surfaces adjacent to the corners, respectively, such that the corners and the predetermined regions of the first and second end surfaces may be exposed.

Further, the first and second external electrodes 131 and 132 may extend from the first and second end surfaces of the ceramic body to the lower surface of the ceramic body, respectively. For example, the first and second external electrodes may include band parts extending to the lower surface of the ceramic body, respectively.

In addition, the first and second external electrodes 131 and 132 may cover the entirety of the portions of the first and second lead parts 121b and 122b exposed to the external surfaces of the ceramic body, respectively. In a case in which the portions of the first and second lead parts exposed to the external surfaces of the ceramic body, respectively, are not covered by the external electrodes, a risk that the ceramic body will be damaged due to an external physical or chemical stimulus may be increased.

A height of each of the first and second external electrodes 131 and 132 disposed on the first and second end surfaces 3 and 4 may be equal to or less than ½ of the thickness of the ceramic body in order to efficiently move the center of gravity of the multilayer ceramic capacitor downwardly in the thickness direction of the ceramic body, but is not limited thereto.

In a case in which the external electrodes are substantially symmetrical with respect to a central portion of the ceramic body in the thickness direction thereof, unlike an exemplary embodiment of the present disclosure, the center of gravity of the multilayer ceramic capacitor may be formed at a position approximately similar to that of the center of gravity of the ceramic body. However, in a case in which the first and second external electrodes 131 and 132 are partially disposed on the first and second end surfaces downwardly in the thickness direction of the ceramic body as in an exemplary embodiment of the present disclosure, the center of gravity of the multilayer ceramic capacitor moves downwardly in the thickness direction of the ceramic body, whereby mounting stability may be secured at the time of mounting the multilayer ceramic capacitor on the board.

The first and second external electrodes 131 and 132 may be formed of, for example, copper (Cu), silver (Ag), nickel (Ni), or the like, but is not limited thereto.

The first and second external electrodes 131 and 132 may be formed by applying and then sintering a conductive paste prepared by adding a glass frit to a metal powder, but is not limited thereto.

The conductive paste may be applied by a method of dipping the ceramic body in the conductive paste or a screen printing method, but is not limited thereto.

In a case in which the conductive paste is applied by the dipping method, the ceramic body may be inclined at a predetermined angle to thereby be dipped in the conductive paste in such a manner that the conductive paste may be partially applied to the end surfaces of the ceramic body in the thickness direction thereof, to which the first and second lead parts are exposed.

As described above, according to an exemplary embodiment of the present disclosure, the external electrodes may partially face the end surfaces downwardly in the thickness direction of the ceramic body, such that the center of gravity of the multilayer ceramic capacitor may be positioned below the center of gravity of the ceramic body in the thickness direction. Therefore, a phenomenon in which a chip topples over at the time of mounting the multilayer ceramic capacitor on the board occurs less, whereby mounting stability may be secured.

Assembly Board 200 having Multilayer Ceramic Capacitor

Figure 5:
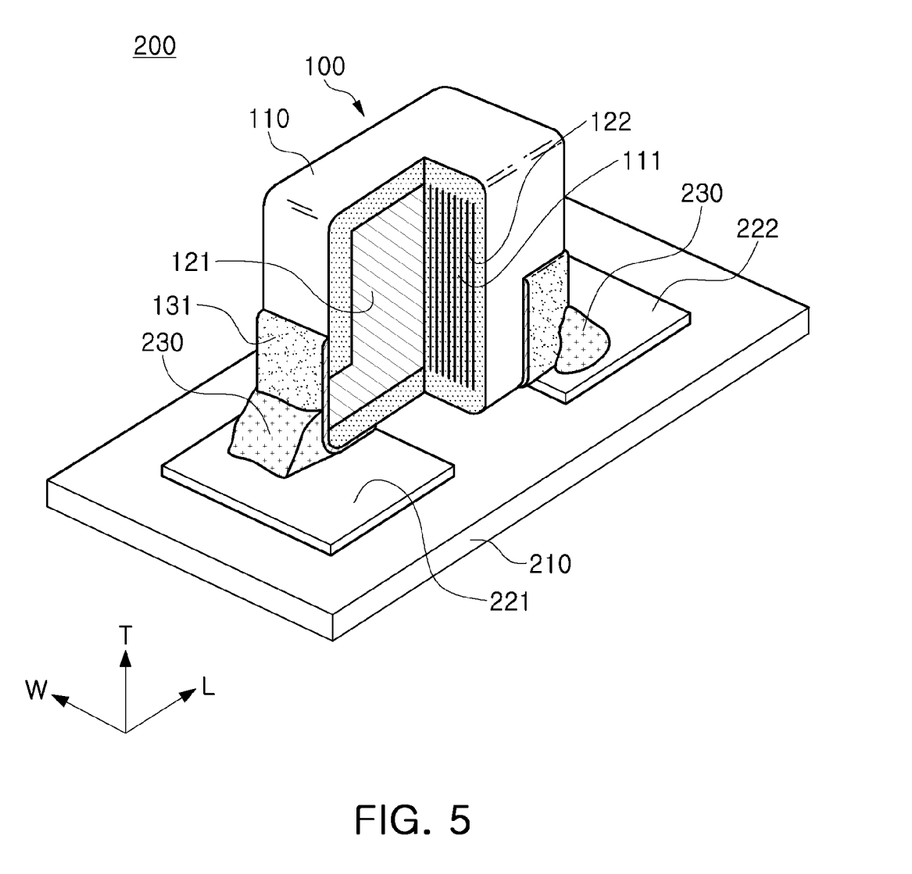
FIG. 5 is a perspective view illustrating an assembly board having a multilayer ceramic capacitor according to an exemplary embodiment of the present disclosure.

FIG. 5 is a perspective view illustrating a board 200 having a multilayer ceramic capacitor according to an exemplary embodiment of the present disclosure.

Referring to FIG. 5, the board 200 having the multilayer ceramic capacitor according to an exemplary embodiment of the present disclosure may include the multilayer ceramic capacitor 100, a printed circuit board 210 on which the multilayer ceramic capacitor 100 is mounted, and first and second electrode pads 221 and 222 formed on an upper surface of the printed circuit board 210 to be spaced apart from each other.

Here, the first and second external electrodes 131 and 132 of the multilayer ceramic capacitor 100 may be electrically connected to the printed circuit board 210 by solder 230 in a state in which they contact the first and second electrode pads 221 and 222, respectively.

That is, according to the exemplary embodiment, the board 200 having a multilayer ceramic capacitor includes: the printed circuit board having the first and second electrode pads disposed thereon; and the multilayer ceramic capacitor installed on the printed circuit board, wherein the multilayer ceramic capacitor includes a ceramic body including a plurality of dielectric layers and having upper and lower surfaces opposing each other in a thickness direction thereof and first and second end surfaces opposing each other in a length direction thereof, a thickness of the ceramic body being greater than a width thereof, first and second external electrodes disposed on the first and second end surfaces, respectively, to partially face one surface of the ceramic body in the thickness direction thereof, and first and second internal electrodes stacked in a width direction of the ceramic body within the ceramic body with each of the dielectric layers interposed therebetween and connected to the first and second external electrodes, respectively, and the multilayer ceramic capacitor is mounted on the printed circuit board such that the lower surface of the ceramic body is adjacent to and faces the printed circuit board.

The multilayer ceramic capacitor 100 may include the first and second external electrodes formed on external surfaces of the ceramic body 110, respectively, and connected to the first and second internal electrodes, respectively. Since the first and second external electrodes 131 and 132 partially face one surface of the ceramic body in the thickness direction thereof so that they are adjacent to the lower surface of the ceramic body, increased stability may be secured at the time of mounting the multilayer ceramic capacitor on the board.

In the board having a multilayer ceramic capacitor, a description of the same contents as those of the multilayer ceramic capacitor described above will be omitted in order to avoid an overlapped description.

As set forth above, according to exemplary embodiments of the present disclosure, the multilayer ceramic capacitor allowing for a decrease in a phenomenon in which a chip topples over at the time of mounting the multilayer ceramic capacitor on a board, while having excellent mounting stability, and the board having the same may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body having upper and lower surfaces opposing each other in a thickness direction thereof, and first and second end surfaces opposing each other in a length direction thereof, a thickness of the ceramic body being greater than a width thereof;
a first external electrode disposed on the first end surface to allow a predetermined region of the first end surface adjacent to the upper surface to be exposed;
a second external electrode disposed on the second end surface to allow a predetermined region of the second end surface adjacent to the upper surface to be exposed; and first and second internal electrodes disposed within the ceramic body, stacked in a width direction of the ceramic body, and connected to the first and second external electrodes, respectively.

2. The multilayer ceramic capacitor of claim 1, wherein the first internal electrode includes a first main electrode part, and a first lead part connected to the first main electrode part and protruding to the first end surface, the second internal electrode includes a second main electrode part, and a second lead part connected to the second main electrode part and protruding to the second end surface, and each of the first and second lead parts has a width narrower than that of each of the first and second main electrode parts.

3. The multilayer ceramic capacitor of claim 1, wherein the first internal electrode includes a first lead part exposed to the first end surface, the second internal electrode includes a second lead part exposed to the second end surface, and a distance of a portion of the first lead part exposed to the first end surface and a distance of a portion of the second lead part exposed to the second end surface are equal to or less than ⅔ of the thickness of the ceramic body.

4. The multilayer ceramic capacitor of claim 1, wherein the first and second external electrodes include band parts extending along the lower surface of the ceramic body, respectively.

5. The multilayer ceramic capacitor of claim 1, wherein the first and second internal electrodes are disposed to be perpendicular to a mounting surface of the ceramic body.

6. The multilayer ceramic capacitor of claim 1, wherein the center of gravity of the multilayer ceramic capacitor is positioned below the center of gravity of the ceramic body.

7. The multilayer ceramic capacitor of claim 1, wherein a height of each of the first and second external electrodes disposed on the first and second end surfaces is equal to or less than ½ of the thickness of the ceramic body.

8. An assembly board having a multilayer ceramic capacitor, comprising:
a printed circuit board having first and second electrode pads disposed thereon; and
the multilayer ceramic capacitor disposed on the printed circuit board,
wherein the multilayer ceramic capacitor includes:
a ceramic body having upper and lower surfaces opposing each other in a thickness direction thereof, and first and second end surfaces opposing each other in a length direction thereof, a thickness of the ceramic body being greater than a width thereof,
a first external electrode disposed on the first end surface to allow a predetermined region of the first end surface adjacent to the upper surface to be exposed,
a second external electrode disposed on the second end surface to allow a predetermined region of the second end surface adjacent to the upper surface to be exposed, and
first and second internal electrodes disposed within the ceramic body, stacked in a width direction of the ceramic body, and connected to the first and second external electrodes, respectively,
wherein the multilayer ceramic capacitor is mounted on the printed circuit board such that the lower surface of the ceramic body is adjacent to and faces the printed circuit board.

9. The assembly board of claim 8, wherein the first internal electrode includes a first main electrode part and a first lead part connected to the first main electrode part and protruding to the first end surface, the second internal electrode includes a second main electrode part and a second lead part connected to the second main electrode part and protruding to the second end surface, and each of the first and second lead parts has a width narrower than that of each of the first and second main electrode parts.

10. The assembly board of claim 8, wherein the first internal electrode includes a first lead part exposed to the first end surface, the second internal electrode includes a second lead part exposed to the second end surface, and a distance of a portion of the first lead part exposed to the first end surface and a distance of a portion of the second lead part exposed to the second end surface are equal to or less than ⅖ of the thickness of the ceramic body.

11. The assembly board of claim 8, wherein the center of gravity of the multilayer ceramic capacitor is positioned below the center of gravity of the ceramic body.

12. A multilayer ceramic capacitor comprising:
a ceramic body having upper and lower surfaces opposing each other in a thickness direction thereof and first and second end surfaces opposing each other in a length direction thereof;
a first group of internal electrodes disposed within the ceramic body and surrounded by a dielectric layer such that a portion of each of the first group of internal electrodes is exposed to the first end surface;
a second group of internal electrodes disposed within the ceramic body and surrounded by the dielectric layer such that a portion of each of the second group of internal electrodes is exposed to the second end surface;
a first external electrode disposed on the first end surface to cover the entirety of the exposed portion of the first group of internal electrodes;
a second external electrode disposed on the second end surface to cover the entirety of the exposed portion of the first group of internal electrodes.

13. The multilayer ceramic capacitor of claim 12, wherein the first group of internal electrodes and the second group of internal electrodes are alternately stacked in a width direction of the ceramic body, and connected to the first and second external electrode respectively.

14. The multilayer ceramic capacitor of claim 12, wherein the exposed portions of the first and second groups of internal electrodes are disposed below the center of first and second end surfaces.

15. The multilayer ceramic capacitor of claim 12, wherein the first and second external electrodes cover the lower surface of the ceramic body.

16. The multilayer ceramic capacitor of claim 12, wherein each of the first group of internal electrodes includes a first main electrode part and a first lead part connected to the first main electrode part and protruding to the first end surface, and each of the second group of internal electrodes includes a second main electrode part and a second lead part connected to the second main electrode part and protruding to the second end surface, and wherein each of the first and second lead parts has a width narrower than that of each of the first and second main electrode parts.

17. The multilayer ceramic capacitor of claim 12, wherein a distance of the exposed portion of the first group of internal electrodes and a distance of the exposed portion of the second group of internal electrodes are equal to or less than ⅖ of the thickness of the ceramic body.

18. The multilayer ceramic capacitor of claim 12, wherein a height of each of the first and second external electrodes disposed on the first and second end surfaces is equal to or less than ½ of the thickness of the ceramic body.

* * * * *